(12) United States Patent  (10) Patent No.: US 7,476,979 B2
Standing et al.  (45) Date of Patent: *Jan. 13, 2009

(54) CHIP SCALE SURFACE MOUNTED DEVICE AND PROCESS OF MANUFACTURE

(75) Inventors: Martin Standing, Tonbridge (GB); Hazel Deborah Schofield, Tonbridge (GB)

(73) Assignee: International Rectifier Corporation, El Segundo, CA (US)

( * ) Notice: Subject to any disclaimer, the term of this patent is extended or adjusted under 35 U.S.C. 154(b) by 246 days.

This patent is subject to a terminal disclaimer.

(21) Appl. No.: 11/446,878

(22) Filed: Jun. 5, 2006

(65) Prior Publication Data

US 2006/0220123 A1  Oct. 5, 2006

Related U.S. Application Data

(62) Division of application No. 10/634,447, filed on Aug. 5, 2003, now Pat. No. 7,122,887, which is a division of application No. 09/819,774, filed on Mar. 28, 2001, now Pat. No. 6,624,522.

(60) Provisional application No. 60/194,522, filed on Apr. 4, 2000.

(51) Int. Cl.
 *H01L 23/48* (2006.01)
(52) U.S. Cl. .................. 257/782; 257/762; 257/784; 257/786
(58) Field of Classification Search .......... 257/782, 257/762, 784, 786
See application file for complete search history.

(56) References Cited

U.S. PATENT DOCUMENTS 3,561,107 A  2/1971  Best et al.
3,871,014 A  3/1975  King et al.
3,972,062 A  7/1976  Hopp
4,021,838 A  5/1977  Warwick
4,454,454 A  6/1984  Valentine
4,604,644 A  8/1986  Beckham et al.
4,639,760 A  1/1987  Granberg et al.
4,646,129 A  2/1987  Yerman et al.

(Continued)

FOREIGN PATENT DOCUMENTS

EP  0 966 038  12/1999

(Continued)

OTHER PUBLICATIONS

Supplementary European Search Report dated Sep. 28, 2007 in European Patent Appl. No. 01922828.7.

(Continued)

*Primary Examiner*—Roy K Potter
(74) *Attorney, Agent, or Firm*—Ostrolenk, Faber, Gerb & Soffen, LLP

(57) ABSTRACT

A chip scale package has a semiconductor MOSFET die which has a top electrode surface covered with a layer of a photosensitive liquid epoxy which is photolithographically patterned to expose portions of the electrode surface and to act as a passivation layer and as a solder mask. A solderable contact layer is then formed over the passivation layer. The individual die are mounted drain side down in a metal clip or can with the drain electrode disposed coplanar with a flange extending from the can bottom.

20 Claims, 6 Drawing Sheets

U.S. PATENT DOCUMENTS

| | | | |
|---|---|---|---|
| 5,047,833 A | 9/1991 | Gould | |
| 5,075,759 A | 12/1991 | Moline | |
| 5,182,632 A | 1/1993 | Bechtel et al. | |
| 5,217,922 A | 6/1993 | Akasaki et al. | |
| 5,311,402 A | 5/1994 | Kobayashi et al. | |
| 5,313,366 A | 5/1994 | Gaudenzi et al. | |
| 5,367,435 A | 11/1994 | Andros et al. | |
| 5,371,404 A | 12/1994 | Juskey et al. | |
| 5,381,039 A | 1/1995 | Morrison | |
| 5,394,490 A | 2/1995 | Kato et al. | |
| 5,397,921 A | 3/1995 | Karnezos | |
| 5,447,886 A | 9/1995 | Rai | |
| 5,448,114 A | 9/1995 | Kondoh et al. | |
| 5,451,544 A | 9/1995 | Gould | |
| 5,454,160 A | 10/1995 | Nickel | |
| 5,455,456 A | 10/1995 | Newman | |
| 5,477,087 A | 12/1995 | Kawakita et al. | |
| 5,510,758 A | 4/1996 | Fujita et al. | |
| 5,512,786 A | 4/1996 | Imamura et al. | |
| 5,532,512 A | 7/1996 | Fillion et al. | |
| 5,554,887 A | 9/1996 | Sawai et al. | |
| 5,578,869 A | 11/1996 | Hoffman et al. | |
| 5,654,590 A | 8/1997 | Kuramochi | |
| 5,703,405 A | 12/1997 | Zeber | |
| 5,726,489 A | 3/1998 | Matsuda et al. | |
| 5,726,501 A | 3/1998 | Matsubara | |
| 5,726,502 A | 3/1998 | Beddingfield | |
| 5,729,440 A | 3/1998 | Jimarez et al. | |
| 5,734,201 A | 3/1998 | Djennas et al. | |
| 5,739,585 A | 4/1998 | Akram et al. | |
| 5,814,884 A | 9/1998 | Davis et al. | |
| 5,814,894 A | 9/1998 | Igarashi et al. | |
| 5,841,183 A | 11/1998 | Ariyoshi | |
| 5,904,499 A | 5/1999 | Pace | |
| 6,051,888 A | 4/2000 | Dahl | |
| 6,133,634 A | 10/2000 | Joshi | |
| 6,303,974 B1 | 10/2001 | Irons et al. | |
| 6,391,687 B1 | 5/2002 | Cabahug et al. | |
| 6,624,522 B2 * | 9/2003 | Standing et al. | 257/782 |
| 6,720,647 B2 | 4/2004 | Fukuizumi | |
| 6,744,124 B1 | 6/2004 | Chang et al. | |
| 2001/0048116 A1 | 12/2001 | Standing et al. | |

FOREIGN PATENT DOCUMENTS

| | | |
|---|---|---|
| EP | 0 978 871 | 2/2000 |
| JP | 5-129516 | 5/1993 |
| JP | 07-202064 | 8/1995 |
| JP | 11-054673 | 2/1999 |
| JP | 11195680 | 7/1999 |
| JP | 2000-243887 | 9/2000 |
| WO | WO 99/65077 | 12/1999 |

OTHER PUBLICATIONS

Mosfet BGA Design Guide 2004-Fairchild Semiconductor, pp. i-ii and pp. 1-43.

* cited by examiner

CHIP SCALE SURFACE MOUNTED DEVICE AND PROCESS OF MANUFACTURE

RELATED APPLICATIONS

This application is a divisional of U.S. application Ser. No. 10/634,447, filed Aug. 5, 2003 by Martin Standing and Hazel Deborah Schofield entitled CHIP SCALE SURFACE MOUNTED DEVICE AND PROCESS OF MANUFACTURE which application is a divisional of U.S. application Ser. No. 09/819,774, filed Mar. 28, 2001 by Martin Standing and Hazel Deborah Schofield entitled CHIP SCALE SURFACE MOUNTED DEVICE AND PROCESS OF MANUFACTURE and is related to and claims priority to provisional application Ser. No. 60/194,522, filed Apr. 4, 2000 in the names of Martin Standing and Hazel Deborah Schofield.

BACKGROUND OF THE INVENTION

This invention relates to semiconductor devices and more specifically relates to a process for the low cost manufacture of a novel semiconductor device.

Semiconductor devices and housings are well known. In prior art devices, the housing area is frequently a large multiple of the area of the semiconductor device. Further, in many known semiconductor device packages, heat is taken out only from one side of the die, usually the bottom surface. Further, in present packages the manufacturing process is costly, using single device handling techniques.

More specifically, in present semiconductor devices, particularly power MOSgated devices, the top contact (the source) is generally an aluminum contact containing about 1.0% silicon (hereafter an aluminum contact). The aluminum contact is used because it is well adapted to the wafer manufacturing process. However, it is difficult to form electrical connections to such aluminum contacts so a wire bond process is usually used in which a wire is ultrasonically bonded to the underlying aluminum contact. These wire-bond connections have a limited area and are thus a source of electrical resistance ($R_{DSON}$) and of heat generation during operation. However, the bottom drain contact is frequently a trimetal which is easily solderable or otherwise electrically connectable to a wide area contact surface without wire bonding as shown, for example, in U.S. Pat. No. 5,451,544. Heat is primarily removed from the silicon die at the back contact surface, even though most heat is generated at the junction in the top surface and at the wire bonds.

It is further known that solderable top contacts can be made to the top surface of a die, as shown in U.S. Pat. No. 5,047,833. However, the packages used for such solderable top contact structures have had very large "footprints" in comparison to the die area.

It would be desirable to produce a package design and process for its manufacture which would use a smaller package for the same die, while improving electrical characteristics such as $R_{DSON}$ of a MOSgated semiconductor type device. It would be further desirable to produce such devices in a process which permits batch handling with reduced equipment on the production line and lower costs.

BRIEF SUMMARY OF THE INVENTION

In accordance with one aspect of the invention, the source side of a MOSgated device wafer is covered with a passivation layer, preferably a photosensitive liquid epoxy, or a silicon nitride layer, or the like. The wafer is coated by a spinning, screening, or otherwise depositing the liquid epoxy onto the wafer surface. The material is then dried and the coated wafer is exposed using standard photolithographic techniques to image the wafer and openings are formed in the passivation layer to produce a plurality of spaced exposed surface areas of the underlying source metal and a similar opening to expose the underlying gate electrode of each die on the wafer. Thus, the novel passivation layer acts as a conventional passivation layer, but further acts as a plating resist (if required) and as a solder mask, designating and shaping the solder areas. The openings in the novel passivation layer can be made through to a conventional underlying solderable top metal such as a titanium/tungsten/nickel/silver metal. Alternatively, if the underlying metal is the more conventional aluminum metal the exposed aluminum can be plated with nickel and gold flash or other series of metals, resulting in a solderable surface, using the passivation as a plating resist. The tops of the plated metal segments are easily solderable, or otherwise contacted with low resistance, as compared to the high resistance connection of the usual wire bond to an aluminum electrode.

The source contact areas may have various geometries and can even constitute a single large area region.

The wafer is then sawn or otherwise singulated into individual die. The individual die are then placed source-side down and a U-shaped or cup shaped, partially plated drain clip is connected to the solderable drain side of the die, using a conductive epoxy or solder, or the like to bond the drain clip to the bottom drain electrode of the die. The bottoms of the legs of the drain clip are coplanar with the source-side surface (that is the tops of the contact projections) of the die. The outer surface of the die is then over molded in a mold tray. A large number of die with such drain clips can be simultaneously molded in the mold tray.

The bonding material may be protected with a fillet of passive material or by overmolding all, or a part of the assembly. The parts can be made in production by using a lead frame, a continuous strip, or by molding devices in a single block and singulating devices from that block.

After molding, the devices are tested and laser marked and are again sawn into individual devices.

DETAILED DESCRIPTION OF THE DRAWINGS

The present invention provides a novel package for semiconductor die of the kind having power or other electrodes on opposite surfaces of the die and makes it possible, with low cost manufacturing techniques, to make both electrodes available for surface mounting on a common support surface, for example the metallized pattern on a printed circuit board. While the invention is described with reference to a vertical conduction power MOSFET having the gate and source electrode on one surface and a drain electrode on the opposite surface, the invention is equally applicable to IGBTs, thyristors, diodes and the like of various topologies.

Thus, as will be seen, a novel die clip surrounds and contacts at least a portion of the back side electrode (a drain electrode in a MOSFET) and at least one leg of the clip extends over an edge of the die and terminates in a plane which is coplanar with, but insulated from the front surface contacts (gate and source in a MOSFET). The device may then be overmolded around the back and sides of the die and clip to present flat, coplanar solderable contact surfaces for all die electrodes to a mounting surface.

All top contact surfaces are formed, using a novel solder mask to form easily solderable contact surfaces on the die top surface, while the die are in the wafer stage. Drain clips are then attached to the die after die singulation and are overmolded in a batch molding process.

Figure 1:
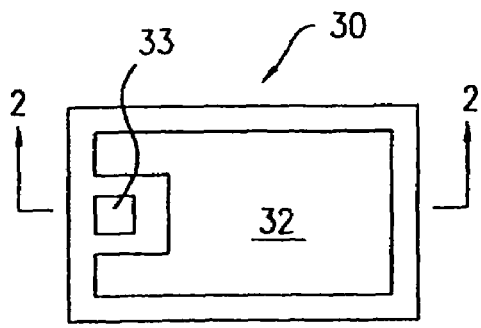
FIG. 1 is a top view of a singulated power MOSFET die which can be housed in accordance with the invention.
Figure 2:
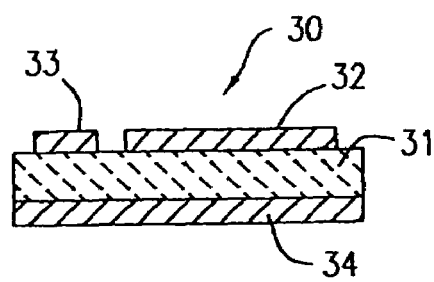
FIG. 2 is a cross-section of FIG. 1 taken across section line 2-2 in FIG. 1.

FIG. 1 shows a typical power MOSFET 30 to which the invention can apply. The die 30 may be of the type shown in U.S. Pat. No. 5,795,793 but can be any kind of die having a junction containing silicon body 31, a top aluminum (that is, aluminum with 1.0% silicon) source electrode 32, an aluminum gate electrode 33 and a bottom drain electrode 34, which may be a conventional easily solderable trimetal. The top aluminum layer may be any other suitable metallic material. Connections are normally made to aluminum electrodes 32 and 33 by wire bonding.

Figure 3:
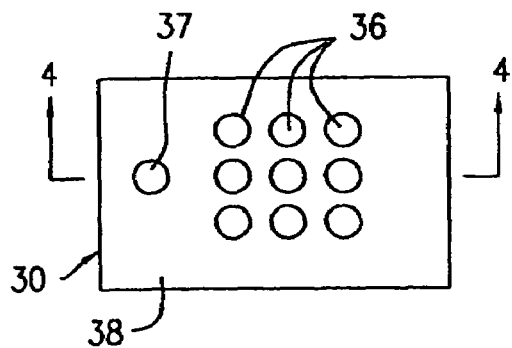
FIG. 3 is a top view of the die of FIG. 1 after it has been processed in accordance with the invention to define a plurality of separate "solderable" source contact areas and a "solderable" gate area.
Figure 4:
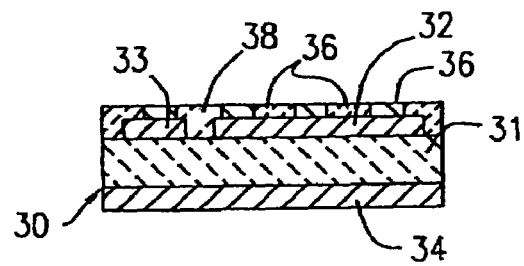
FIG. 4 is a cross-section of FIG. 3 taken across section line 4-4 in FIG. 3.

In accordance with the invention and as will be later described, a plurality of easily solderable contact posts 36 are secured to (formed on) the source electrode 32 and a contact post 37 is secured to the gate electrode 33 as shown in FIGS. 3 and 4. Contacts 36 and 37 are sub-flush by the thickness of the passivation in the case of a silver top metal die; and by about one-half the passivation thickness in the case of a plated aluminum top metal die. The flat contact tops are coplanar. Contact to these contact surfaces is made by a solder paste, which at minimum printable solder thickness is about 4 to 5 times as thick as layer 38.

Figure 5:
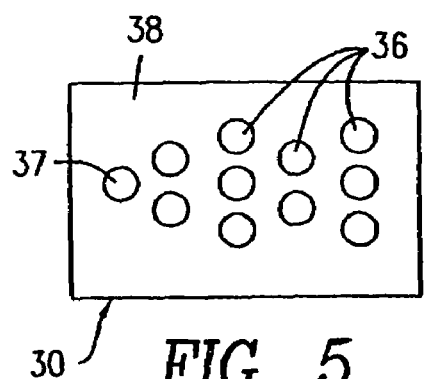
FIG. 5 is a view like that of FIG. 3 of a die with a modified source contact pattern.
Figure 6:
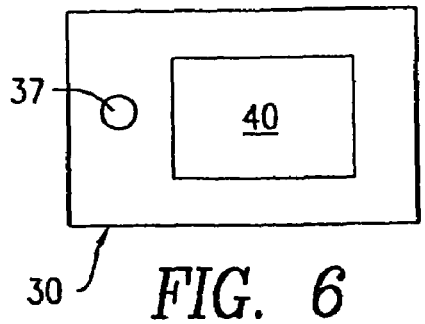
FIG. 6 is a view like that of FIGS. 3 and 5 of a still further and large area "solderable" source contact pattern.
Figure 11:
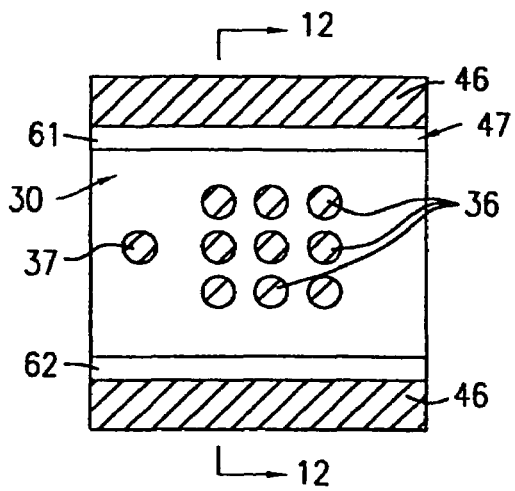
FIG. 11 is a bottom view of the subassembly of the die of FIGS. 3 and 4 and the clip of FIG. 9.
Figure 18:
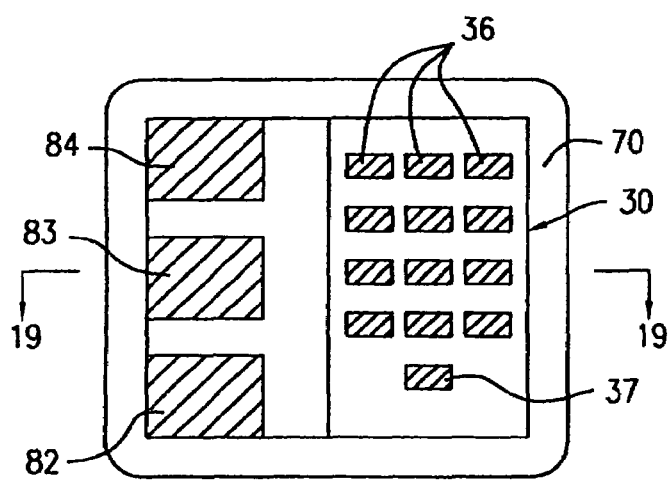
FIG. 18 is a bottom view of assembly of the clip of FIGS. 16 and 17 with a die of the general kind of that of FIGS. 3 and 4 after overmolding.

The pattern of contacts 36 can take different forms such as those shown in FIGS. 5, 11 and 18. Further, it is also possible to use a large area solderable contact such as source contacts 40 or 41, for the die of FIG. 6 and FIGS. 7 and 8. A metallizing process for forming contacts 36, 37 and 40 shall be later described.

Figure 7:
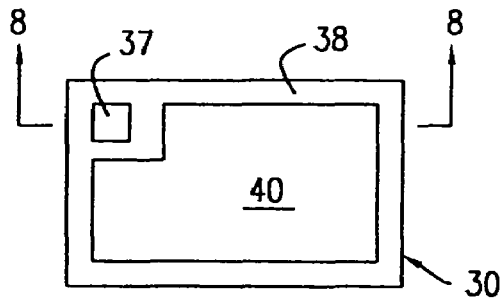
FIG. 7 is a top view of a still further contact topology (with a corner gate) formed using the process of the invention.
Figure 8:
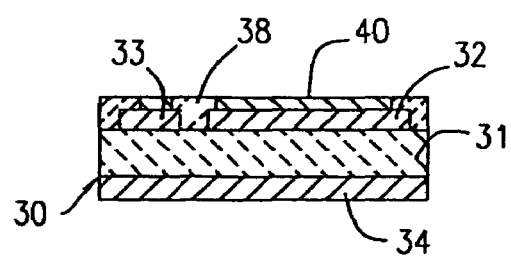
FIG. 8 is a cross-section of FIG. 7 taken across section lines 8-8 in FIG. 7.
Figure 9:
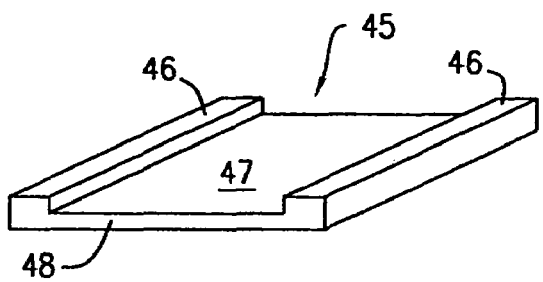
FIG. 9 is a perspective view of a first form of a drain clip of the invention.

In forming the novel package with die prepared as shown in FIGS. 3 to 8, a novel conductive plated (or partly plated) metal clip 45 of FIG. 9 is employed. Clip 45 may be a copper alloy with at least partially plated silver surfaces where contact to other surfaces is to be made.

Clip 45 has a general "U-shape" with shallow legs 46 of a length slightly greater than the thickness of die 31 as measured from the surface 47 to the free surfaces of columns 36, 37, plus the thickness of an adhesive used to connect the drain to the plated interior surface 47 of the flat thin web 48 of the clip. For example, the clip may have a total thickness along the full length of legs 45 of 0.7 mm and a length from surface 47 to the free end of legs 46 of about 0.39 mm. the distance between the legs 46 depends on the size of the die, and a distance of 5.6 mm has been used for a size 4.6 die of International Rectifier Corporation, with a total width of about 1.5 mm for each of legs 46.

Figure 10:
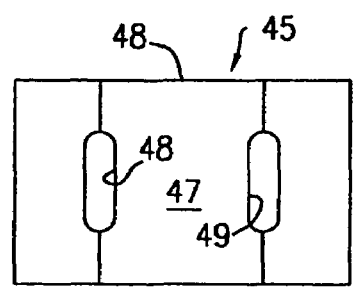
FIG. 10 is a top view of the drain clip of FIG. 9, with mold lock openings formed in the clip.

Mold lock openings 48 and 49 may also be formed in the clip 45 as shown in FIG. 10.

Figure 12:
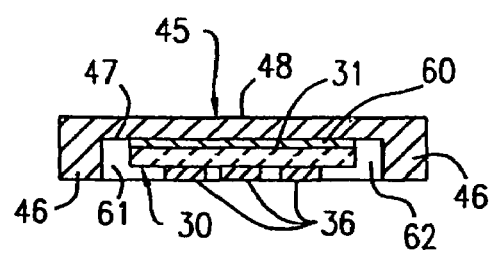
FIG. 12 is a cross-section of FIG. 11 taken across section line 12-12 in FIG. 11.

In accordance with a feature of the invention, the solderable bottom drain electrode 34 of the die 30 is electrically connected to and secured to the plated interior of drain clip 45 as by a conductive adhesive 60 as shown in FIG. 12. The adhesive can, for example, be a silver loaded epoxy material which is suitably cured. Gaps 61 and 62 are left between the side edges of die 30 and the opposite sides of legs 46 of clip 45.

The structure is dimensioned so that the free surfaces of legs 46 (the drain connector) and posts 36 and 37 are coplanar.

Figure 13:
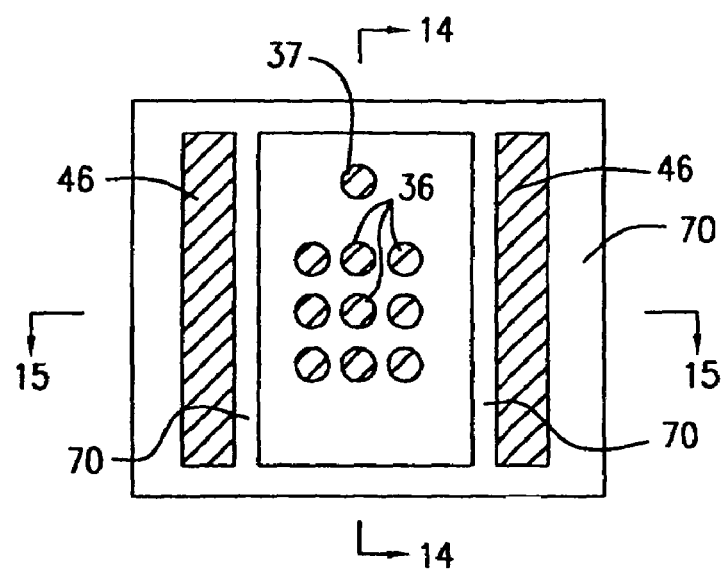
FIG. 13 shows the subassembly of FIGS. 11 and 12 after overmolding in a molding tray.
Figure 14:
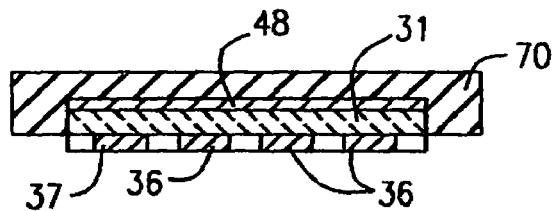
FIG. 14 is a cross-section of FIG. 13, taken across section lines 14-14 in FIG. 13.
Figure 15:
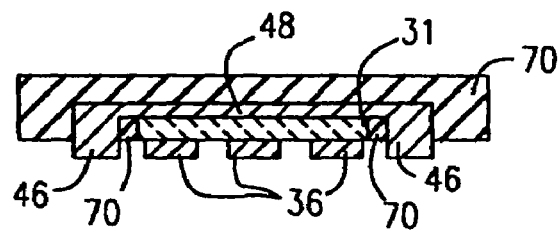
FIG. 15 is a cross-section of FIG. 13 taken across section line 15-15 in FIG. 13.
Figure 16:
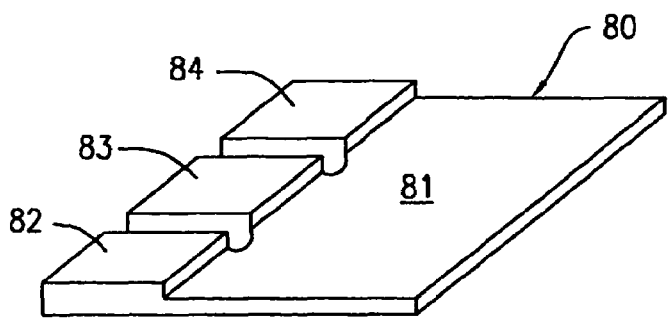
FIG. 16 is a perspective view of a further embodiment of a drain clip.
Figure 17:
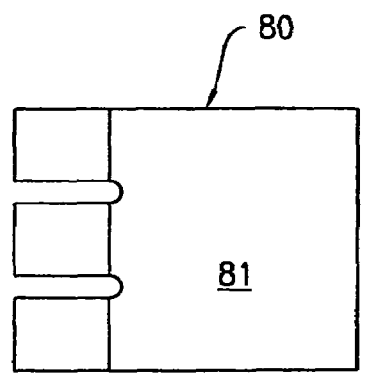
FIG. 17 is a top view of the clip of FIG. 16.

Thereafter and as shown in FIGS. 13, 14 and 15, the device of FIGS. 11 and 12 is overmolded with mold compound 70 in a mold tray. Mold compound 70 lies over the full exposed outer surface of clip 45, except for the outer free surfaces of legs 46. Mold compound fills into the gaps 61 and 62 as shown in FIGS. 13 and 15. The device is now ready for surface mounting to conductive traces on a printed circuit board, which are aligned with contacts 36, 37 and 46.

Figure 19:
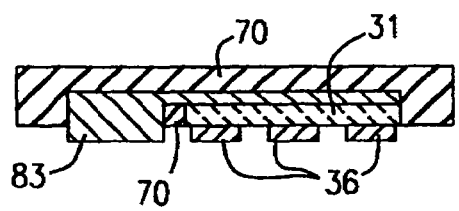
FIG. 19 is a cross-section of FIG. 18 taken across section line 19-19 in FIG. 18.

FIGS. 16 to 19 show a further embodiment of the invention, using a different clip geometry. Thus, the clip 80 of FIGS. 16 and 17 has a web 81 and three segmented projecting legs 82, 83 and 84. A die 30, which has projecting contacts 36 and 37 is first adhered, at its drain contact (not shown) to web 81 as shown in FIGS. 18 and 19 so that contacts 36, 37 and the free surfaces of drain clip projections 82, 83 and 84 lie in a common plane. The device is then overmolded with molded compound 70 in a suitable mold tray.

Figure 21:
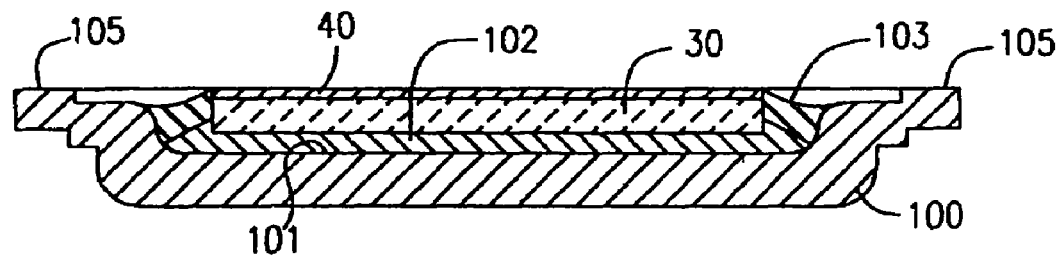
FIG. 21 is a cross-section of FIG. 20 taken across section lines 21-21 in FIG. 20.
Figure 20:
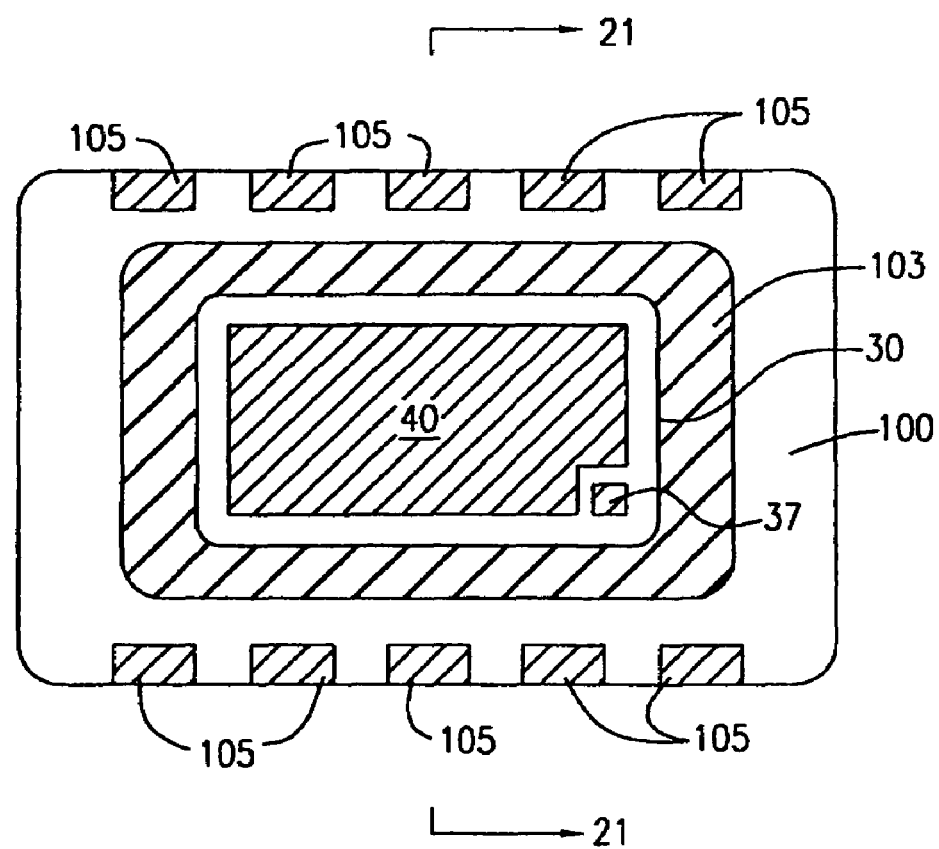
FIG. 20 is a bottom view of a cup shaped drain clip with a die of the topology of FIGS. 7 and 8.

FIGS. 20 and 21 show a still further embodiment of the invention in which the die of FIGS. 7 and 8 is mounted in a cup-shaped clip 100 which is a silver plated copper alloy. Clip 100 has an internal area greater in length and width than the die 30, and, the bottom drain electrode of die 30 is connected to the interior web surface 101 (FIG. 21) by silver loaded (conductive) epoxy 102. The epoxy is cured. Optimally, a ring of low stress high adhesion epoxy 103 may be applied around the die edge, sealing the package and adding structural strength to the package.

The top surface of solderable contact 40 is coplanar with drain clip projection surfaces 105. Thus, all of contacts 105, 40 and 37 will align with contact traces on a printed circuit board. The drain contacts may take any suitable form and could comprise a single contact er side, if desired.

Figure 22:
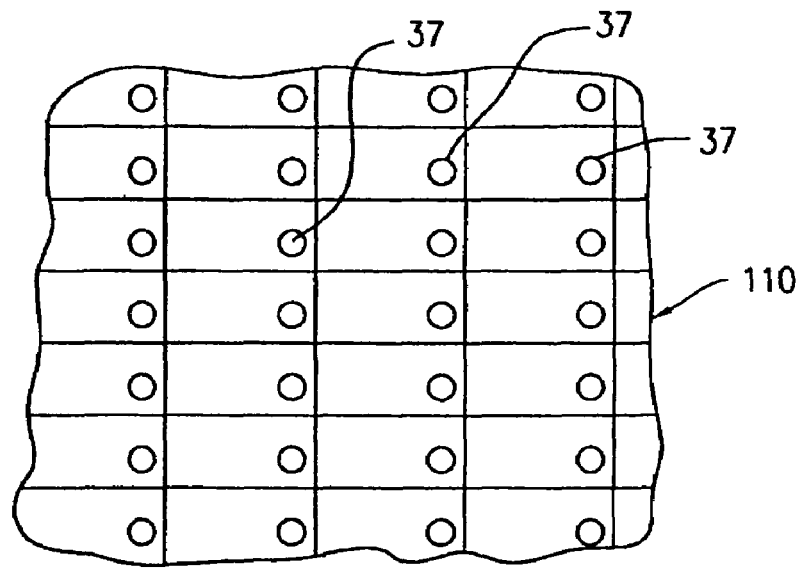
FIG. 22 shows a wafer of MOSFET die before singulation.
Figure 23:
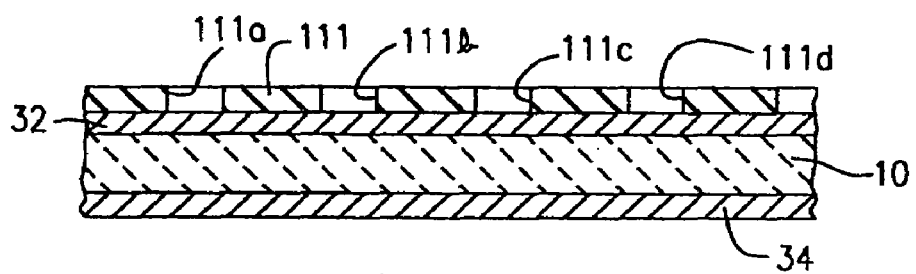
FIG. 23 shows process steps for the formation and patterning of a passivation layer on the source surface of the wafer of FIG. 22.
Figure 24:
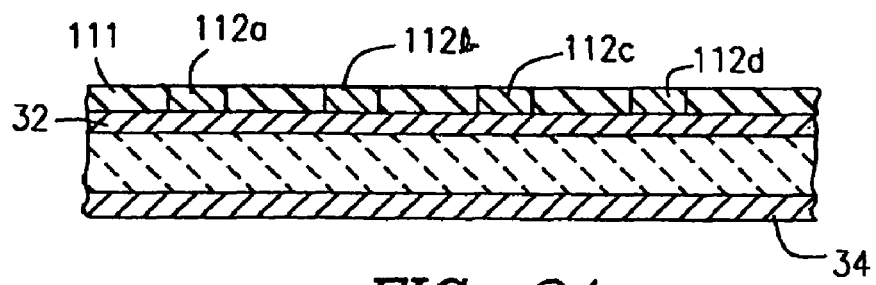
FIG. 24 shows the metalizing atop the passivation layer of FIG. 23.

FIGS. 22 to 24 show a novel process for forming conductive posts on the aluminum electrodes of conventional die. Thus, a plurality of identical die, each having a gate electrode 37 and separate source electrodes (not numbered) are shown within wafer 110 prior to die singulation. While still in wafer form, the top surface of the wafer 110 is coated with a photoimagable solder mask 111. Mask 111 is a photosensitive liquid epoxy which will act as a passivation layer, a plating resist (if required) and a solder mask designating and shaping the solder areas. However, other mask materials, for example, silicon nitride, can be used. Using a conventional reticule, multiple openings 111*a* to 111*d* are formed through the mask to the underlying source and gate contacts on the die top metal. A laser etch process can also be used to form these openings.

As shown in FIG. 24, a series of metals 112 are then plated atop the surface of the wafer and the plating adheres to the metal of source 32 (and other electrodes) which are exposed through openings 111*a* to 111*b*, forming contacts 112*a* to 112*d* with the source and a similar contact to the gate. Metals 112*a* to 112*d* can consist of a first layer of nickel which makes good contact to the aluminum, followed by a gold flash. Alternatively, the nickel can be followed by layers of copper or tin, and the like, ending with an easily solderable metal top surface such a silver.

The wafer is then sawn to separate the die at lines 112 and 113 for example, and the die are singulated. The typical die 30 has the appearance shown in FIGS. 3 to 8 and has a plurality of solderable source contacts and gate contacts which project above insulation surface 50.

The singulated die are then placed drain source-side down, into conductive clips which are plated on their interior as with silver or some other conductive coating. The die is bonded to the clip, using conventional bond material such as a conductive epoxy as previously described. The clips/cans can be presented in the form of a lead frame and the devices can be later singulated from the lead frame.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device package comprising:
a power semiconductor device, said power semiconductor device including a first power electrode on one major surface thereof, and a second power electrode on a second opposing major surface thereof;
a passivation layer over said second power electrode of said power semiconductor device;
at least one solderable body over said second power electrode of said power semiconductor device; and
a conductive clip, said conductive clip having a web portion electrically and mechanically connected to said first power electrode of said power semiconductor device and at least one connection surface that faces a same direction as said at least one solderable body.

2. The semiconductor device package of claim 1, wherein said passivation layer is comprised of an epoxy.

3. The semiconductor device package of claim 1, wherein said passivation layer acts as a solder resist.

4. The semiconductor device package of claim 1, wherein said passivation layer acts as a plating resist.

5. The semiconductor device package of claim 1, further comprising a control electrode on said second opposing major surface, and another solderable body over said control electrode.

6. The semiconductor device package of claim 1, further comprising a plurality of connection surfaces laterally spaced from said at least one connection surface.

7. The semiconductor device package of claim 1, further comprising another connection surface disposed opposite said at least one connection surface.

8. The semiconductor device package of claim 1, wherein said clip is cup-shaped, and said at least one connection surface is disposed on one side thereof.

9. The semiconductor device package of claim 8, further comprising another connection surface disposed on a side opposite said at least one side.

10. The semiconductor device package of claim 1, wherein said clip is comprised of copper.

11. The semiconductor device package of claim 1, wherein said clip is silver-plated.

12. The semiconductor device package of claim 1, wherein said clip does not include a connection surface on at least one side thereof.

13. The semiconductor device package of claim 1, wherein said power semiconductor device is a power MOSFET.

14. The semiconductor device package of claim 1, wherein said power semiconductor device is an IGBT.

15. The semiconductor device package of claim 1, wherein said power semiconductor device is a diode.

16. The semiconductor device package of claim 1, wherein said power semiconductor device is a thyristor.

17. The semiconductor device package of claim 1, further comprising a low stress, high adhesion epoxy disposed around said power semiconductor device.

18. The semiconductor device package of claim 1, wherein said first power electrode is electrically and mechanically connected to said web portion by a conductive adhesive.

19. The semiconductor device package of claim 1, wherein said conductive clip is U-shaped.

20. The semiconductor device package of claim 1, further comprising a mold compound disposed thereon.

* * * * *